United States Patent [19]

Dewa et al.

[11] Patent Number: 5,452,054
[45] Date of Patent: Sep. 19, 1995

[54] VARIABLE ANNULAR ILLUMINATOR FOR PHOTOLITHOGRAPHIC PROJECTION IMAGER

[75] Inventors: Paul G. Dewa, Newark; Paul F. Michaloski, Rochester; Paul J. Tompkins; William N. Partlo, both of Fairport, all of N.Y.

[73] Assignee: General Signal Corporation, Stamford, Conn.

[21] Appl. No.: 342,787

[22] Filed: Nov. 21, 1994

Related U.S. Application Data

[63] Continuation of Ser. No. 24,651, Mar. 1, 1993, abandoned.

[51] Int. Cl.6 ............................................. G03B 27/54
[52] U.S. Cl. .................................... 355/67; 362/268; 362/282
[58] Field of Search ................... 355/67, 53, 70, 71, 355/77; 362/332, 281, 268, 277, 28; 353/201, 203; 359/385, 789

[56] References Cited

U.S. PATENT DOCUMENTS

| | | | |
|---|---|---|---|
| 4,492,439 | 1/1985 | Clegg | 359/709 |
| 4,780,747 | 10/1988 | Suzuki et al. | 355/53 X |
| 5,113,244 | 5/1992 | Curran | 359/709 X |
| 5,173,799 | 12/1992 | Tanuma | 359/328 X |
| 5,245,384 | 9/1993 | Mori | 362/268 X |
| 5,287,142 | 2/1994 | Kamon | 355/53 |
| 5,305,054 | 4/1994 | Suzuki et al. | 355/67 X |
| 5,309,198 | 5/1994 | Nakagawa | 355/67 |
| 5,333,035 | 7/1994 | Shiraishi | 355/53 X |
| 5,383,000 | 1/1995 | Michaloski et al. | 355/67 |

OTHER PUBLICATIONS

"0.25 μm Lithography Using a Deep-UV Stepper with Annular Illumination", by A. Yen, W. N. Partlo, R. W. McCleary, & M. C. Tipton; presented at Microcircuit Engineering 92, Erlangen, Germany in Jun. '92, for publication in Proceedings of same.

"Polarization Effects of Axicons", by David Fink, in *Applied Optics*, Mar. 1979, pp. 581 & 582 (vol. 18, No. 5).

"Mirror System for Uniform Beam Transformation in High-Power Annular Lasers", by J. W. Ogland, in *Applied Optics*, Sep. 1978, vol. 17, No. 18, pp. 2917–2923.

*Primary Examiner*—James C. Yeung
*Assistant Examiner*—Thomas M. Sember
*Attorney, Agent, or Firm*—Eugene Stephens & Associates

[57] ABSTRACT

The illumination of a photolithographic projection imager is given a variable annular intensity profile by using diverging and counter diverging elements that are movable relative to each other in the illumination path. An upstream element diverges the illumination into an annular configuration, the radius of which is set by the distance downstream to the counter diverging element. Convex and concave conical surfaces on the movable elements can accomplish this.

38 Claims, 9 Drawing Sheets

VARIABLE ANNULAR ILLUMINATOR FOR PHOTOLITHOGRAPHIC PROJECTION IMAGER

RELATED APPLICATIONS

This is a continuation of copending parent application No. 08/024,651, filed 1 Mar. 1993, by Paul G. Dewa, Paul F. Michaloski, Paul J. Tompkins, and William N. Partlo, entitled VARIABLE ANNULAR ILLUMINATOR FOR PHOTOLITHOGRAPHIC PROJECTION IMAGER, and abandoned upon the filing of this continuation application.

FIELD OF THE INVENTION

This invention involves illumination systems for microlithographic projection imagers.

BACKGROUND

Off-axis illumination in an annular configuration has increased resolution and depth of focus for photolithographic projection imagers imaging a mask or reticle having dense lines and spaces and dense contacts. This is explained in a paper entitled "0.25 μm Lithography Using a Deep-UV Stepper with Annular Illumination", authored by A. Yen, W. N. Partlo, R. W. McCleary, and M. C. Tipton, and presented at Microcircuit Engineering 92, Erlangen, Germany, in June of 1992, and will be published in "Proceedings of Microcircuit Engineering 92", Erlangen, Germany The advantage of annular illumination involves the diffractive effects of a reticle having dense lines and spaces and dense contacts, and an annular profile of illumination intensity is especially advantageous when imaging a reticle that has a region of densely packed features.

The simplest way to provide annular illumination of a mask or reticle in a photolithographic projection imager has been with a mask arranged at the pupil of the illuminator to block out the central region of the illumination and leave an annular configuration of illumination intensity extending around the masked out central portion. This has the serious disadvantage of reducing the total illumination energy available and thereby slowing down the imaging process.

SUMMARY OF THE INVENTION

We have discovered a way of profiling the illumination for a photolithographic projection imager to produce an annular configuration of illumination intensity without wasting illumination energy. Our preferred way of doing this is also readily variable so that the radius of the annular illumination profile can be varied quickly and conveniently. Besides having this capacity, our illuminator is also preferably able to produce illumination having a standard, non-annular configuration. Moreover, our invention implements these capabilities in a reliable and effective way that an operator can control.

The way our invention accomplishes this is by a diverging element in the illumination path of the illuminator followed by a counter diverging element arranged at a preferably variable distance. The diverging element is preferably refractive and preferably has a conical surface arranged for diverging the illumination into an annular configuration of intensity. The counter diverging element is also preferably refractive, with a conical surface; and it counters the divergence of the illumination and fixes the radius of the annular configuration of illumination intensity as a function of the distance between the two elements. Moving the elements apart enlarges the radius of the annular profile of the illumination, and moving the elements into proximity restores the illumination to an undiverged condition so that the illumination intensity profile does not become annular.

DETAILED DESCRIPTION

Figure 1:
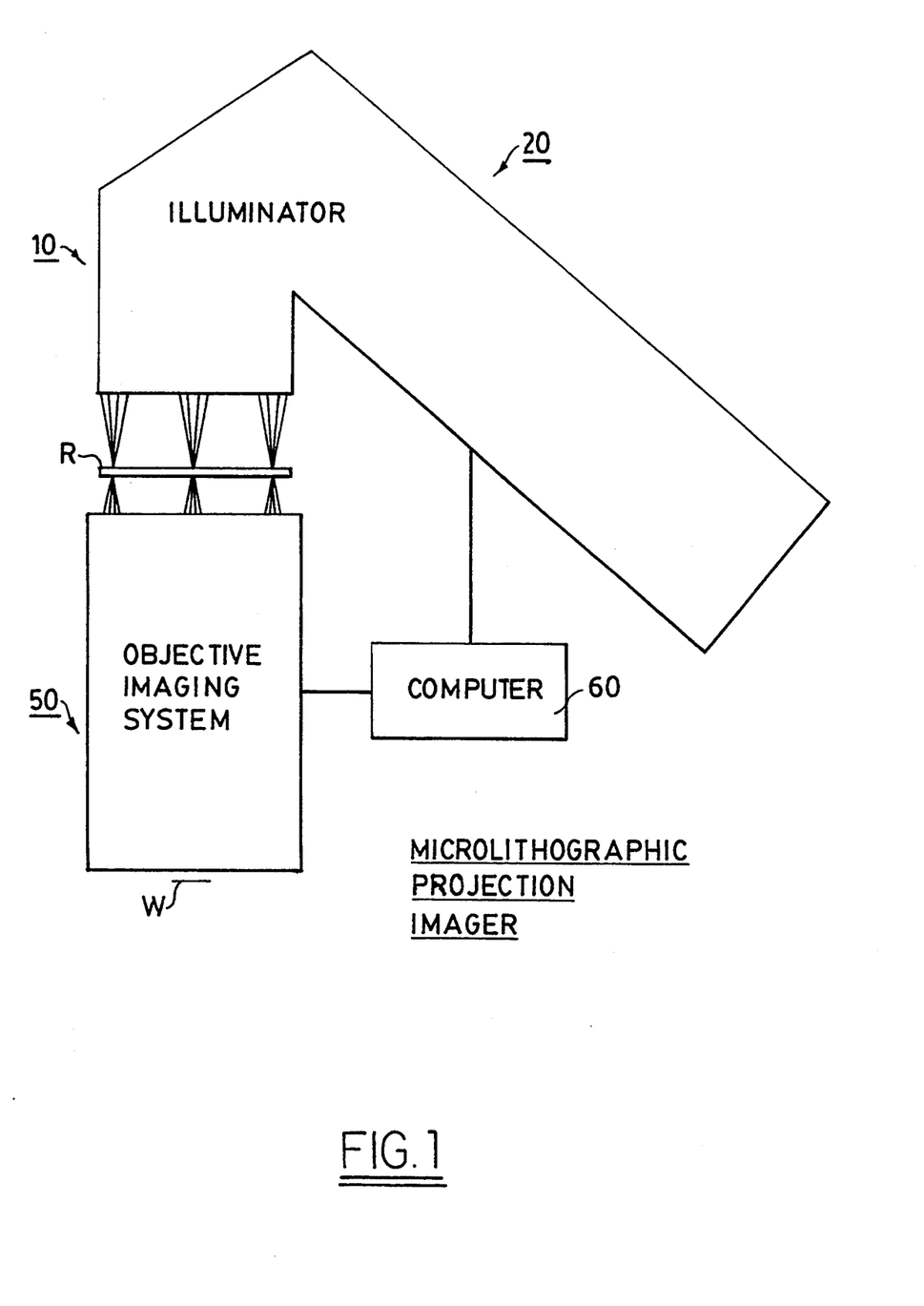
FIG. 1 is a schematic diagram of a microlithographic projection imager including an objective imaging system and an illuminator with an optical system capable of varying an annular intensity profile of the illumination according to the invention.

A microlithographic projection imager 10 suitable for variable annular illumination according to the invention is schematically illustrated in FIG. 1. It includes an illuminator 20 and an objective imaging system 50, both preferably controlled by a computer 60. Light or radiation from a source not indicated is directed through an optical system of illuminator 20 to a reticle plane R where a mask or reticle to be imaged is positioned. Illumination passing through a mask at reticle plane R proceeds through objective imaging system 50 to wafer plane W where the mask is imaged by the transmitted illumination.

Projection imaging can vary with the masks or reticles involved, and reticles that have dense lines and spaces or dense contacts can especially benefit from illumination having an annular intensity profile. Since all reticles do not have dense features, we prefer that illuminator 20 be able to deliver illumination having a standard circular intensity profile that can be used when an annular intensity profile is not desired. We also prefer that the radius of an annular intensity profile be variable for best accommodating the illumination to different configurations of reticles. Finally, we prefer that illuminator 20 satisfy all these conditions without wasting illumination energy, which would slow down the imaging process.

Figure 2:
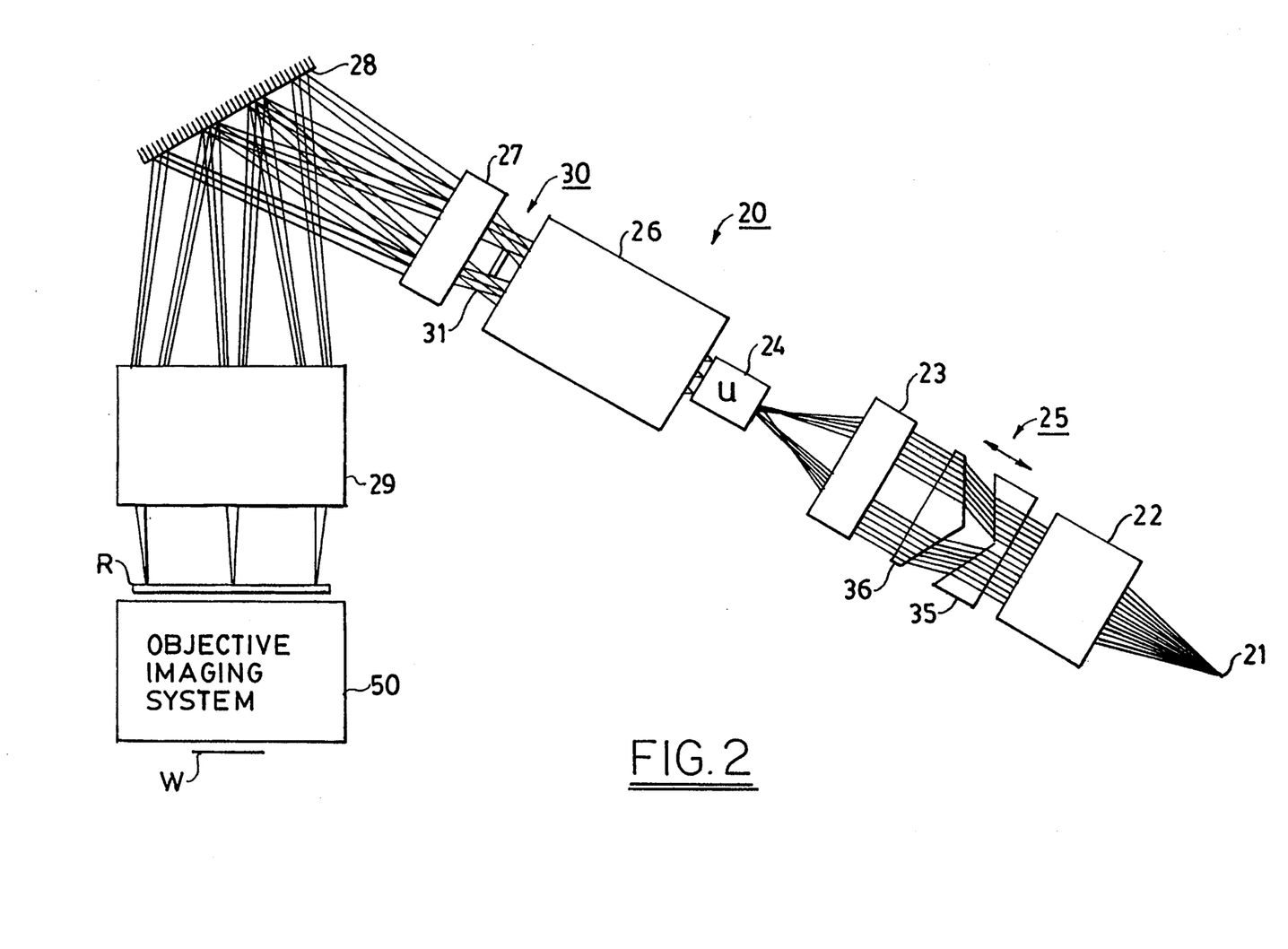
FIGS. 2 and 3 are schematic diagrams of preferred elements of an illuminator optical system that can vary the illumination intensity profile between an annular configuration as shown in FIG. 2 and a non-annular configuration as shown in FIG. 3.

A portion of the optical system of illuminator 20 is schematically illustrated in FIG. 2 to show a preferred way of giving the illumination an intensity profile in an annular configuration. An illumination source schematically represented as point 21 provides the illumination to be profiled and consists of several components that are not illustrated and are not important to the way the illumination is given an annular intensity profile. Suitable source components are also generally known.

Downstream of source 21 is preferably a lens or lens group 22 followed by variable annular illumination intensity profiler 25, whose operation will be explained. Downstream of annular profiler 25 is another lens or lens group 23, a uniformizer 24, and a lens or lens group 26. The pupil region 30 of illuminator 20 is downstream of lens group 26, and a mask 31 can be positioned in pupil region 30 as explained below. Downstream of pupil 30 is a lens or lens group 27, a folding mirror 28, and a final lens or lens group 29. Members 22, 23, 26, 27, and 29 can be varied considerably according to generally known optical design. Uniformizer 24 is preferably a kaleidoscopic rod, but can also be a fly's eye lens formed of an array of a multitude of tiny lenses. It segments the illumination and rearranges the segments to ensure uniformity of the illumination throughout the illumination field, which can be varied from approximately circular to different sizes of annuli by means of profiler 25. The illumination provided with a variable intensity profile is delivered from member 29 to a mask or reticle at reticle plane R and then through objective imaging system 50 to image the reticle—often in reduced size—on a wafer at wafer plane W.

Figure 3:
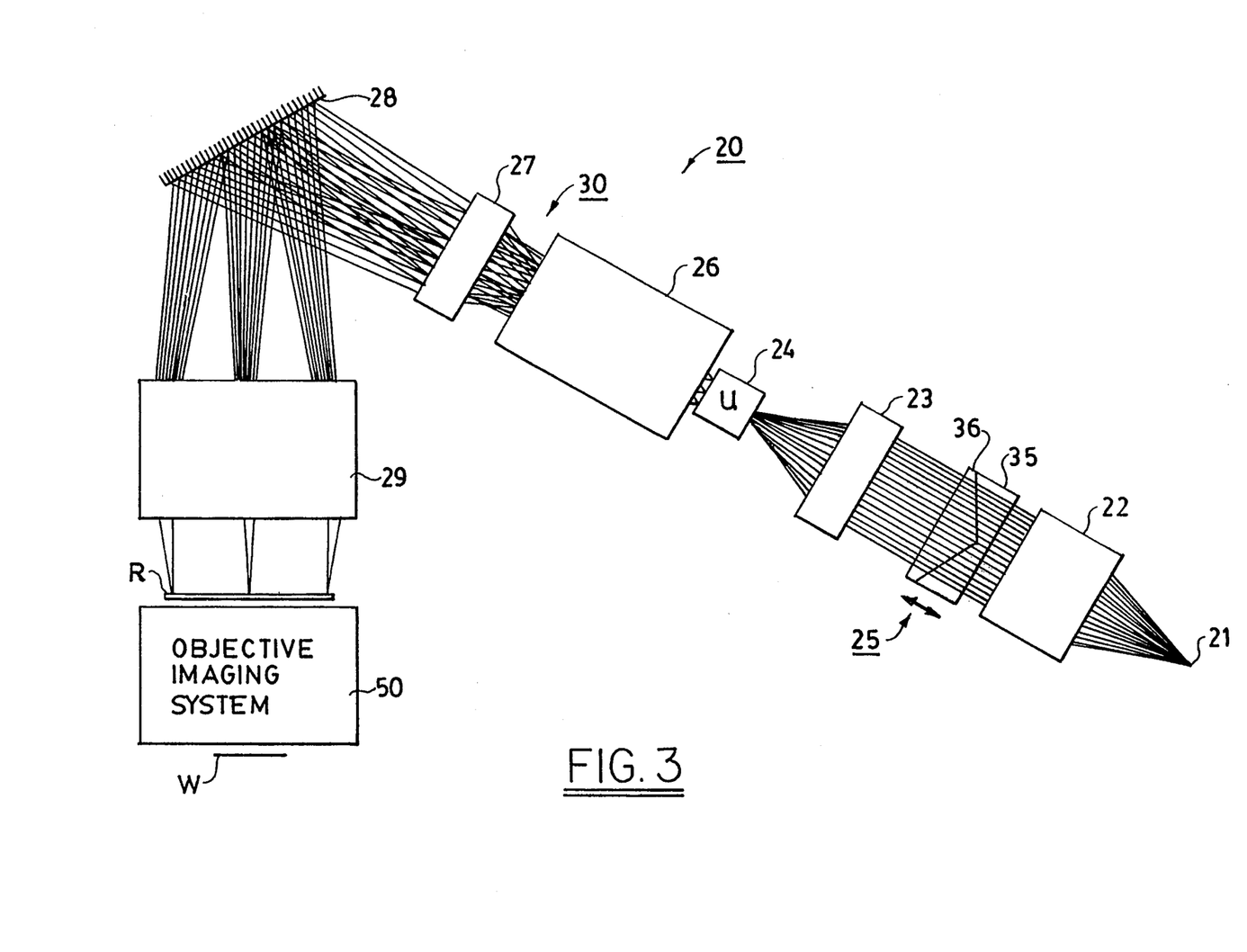

One preferred embodiment of profile varier 25, as shown in FIG. 2, has the form of a pair of refractive elements 35 and 36 with confronting conical surfaces. A concave conical surface of element 35 diverges the illumination into an annular configuration of intensity having a radius that increases with distance downstream from element 35. A convex conical surface of element 36 counters the divergence caused by element 35 to fix the radius of the annular intensity profile. Elements 35 and 36 are preferably movable relative to each other, preferably by moving one or the other, so that the distance between them is variable. The radius of the annular divergence of the illumination is then a function of the distance between elements 35 and 36. As shown in FIG. 3, when elements 35 and 36 are moved into proximity, the illumination divergence caused by element 35 is countered by element 36 before any substantial divergence occurs so that the illumination retains its standard, approximately circular profile. With elements 35 and 36 proximate to each other, profiler 25 is effectively eliminated from the optical system of illuminator 20, which then can be used for imaging reticles with illumination having a standard circular profile.

Several different types of elements can be arranged to serve as profiler 25. For elements 35 and 36 that are illustrated in FIG. 2, the concave and convex conical surfaces preferably have the same conic angle. These surfaces are separated by an air gap, and preferably no optical element is positioned between elements 35 and 36. When moved into the proximate position shown in FIG. 3, the conic surfaces of elements 35 and 36 can be separated by a millimeter or so.

Figure 9:
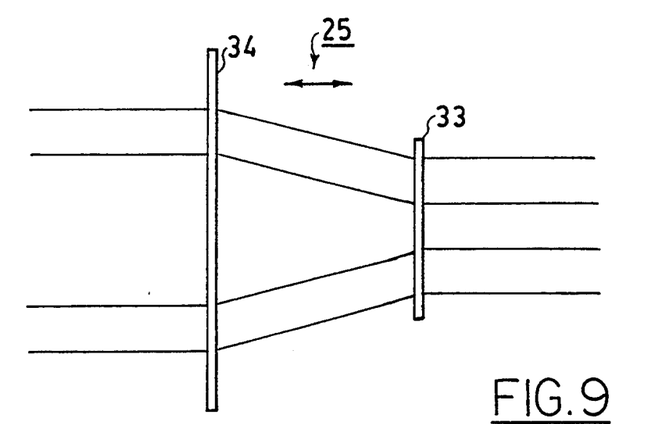
FIGS. 9 and 10 are schematic views of concentric diffractive elements producing divergence and counter divergence and arranged for forming a variable annular illumination intensity profile according to the invention.
Figure 10:
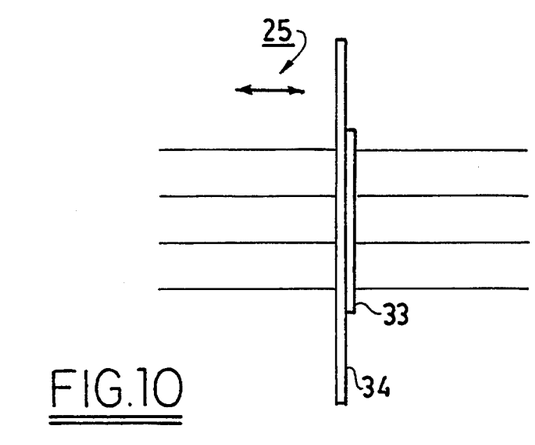

Diffractive elements 33 and 34 can also serve in profiler 25, as shown in FIGS. 9 and 10. The diffractive features of elements 33 and 34 are formed as concentric circles arranged so that element 33 diverges illumination annularly, and element 34 counters the divergence of element 33. This forms an annular illumination intensity profile when elements 33 and 34 are spaced apart, as shown in FIG. 9, and substantially no annular divergence when elements 33 and 34 are moved into proximity, as shown in FIG. 10.

Figure 11:
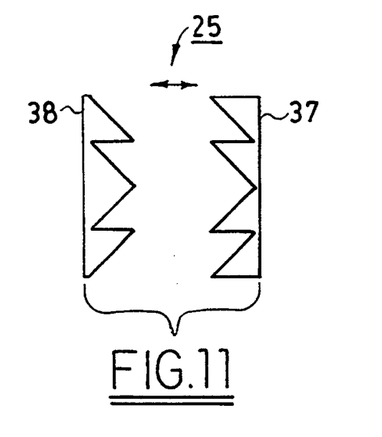
FIG. 11 schematically shows divergent and counter divergent elements formed of faceted refractive elements for practicing the invention.

Another form of varier 25 is refractive elements 37 and 38 that are formed with faceted surfaces, rather than single conical surfaces. In a way that is similar to the function of conic surfaced elements 35 and 36, elements 37 and 38 respectively diverge and counter diverge the illumination passing through so that varying the distance between elements 37 and 38 varies the radius of an annular profile of illumination intensity, as shown in FIG. 11.

Figure 13:
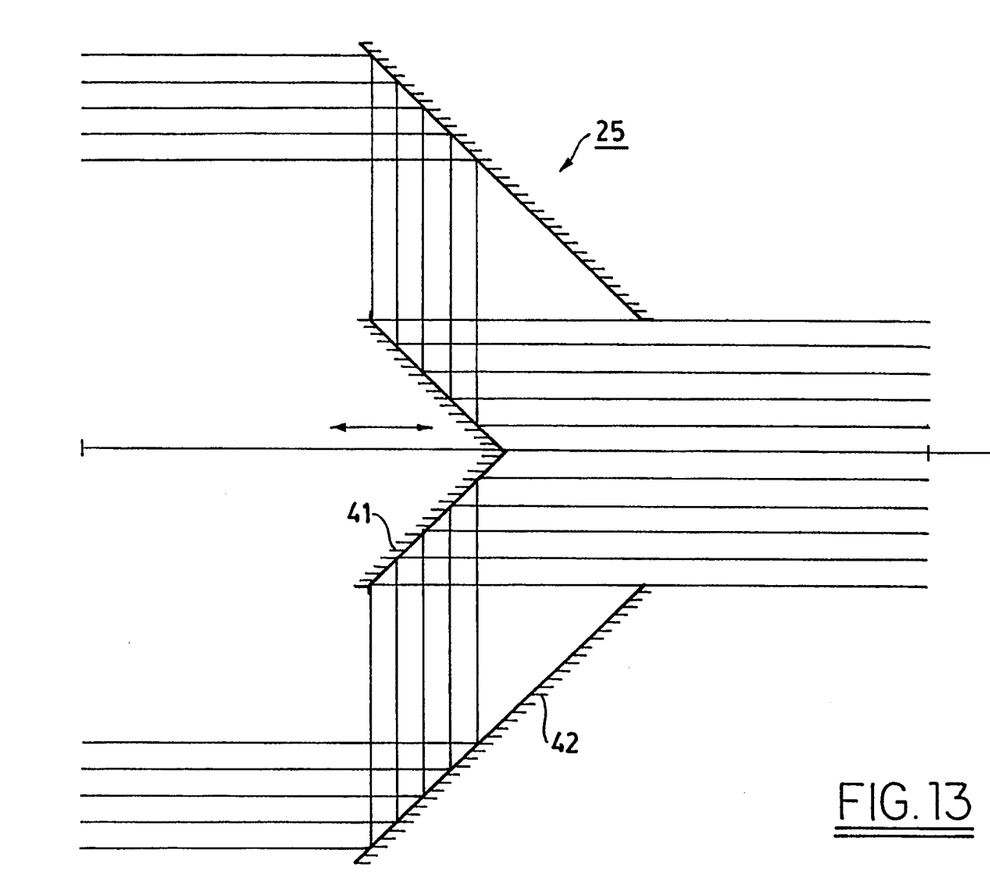
FIG. 13 schematically shows a pair of conical reflective elements arranged for producing variable illumination divergence according to the invention.
Figure 14:
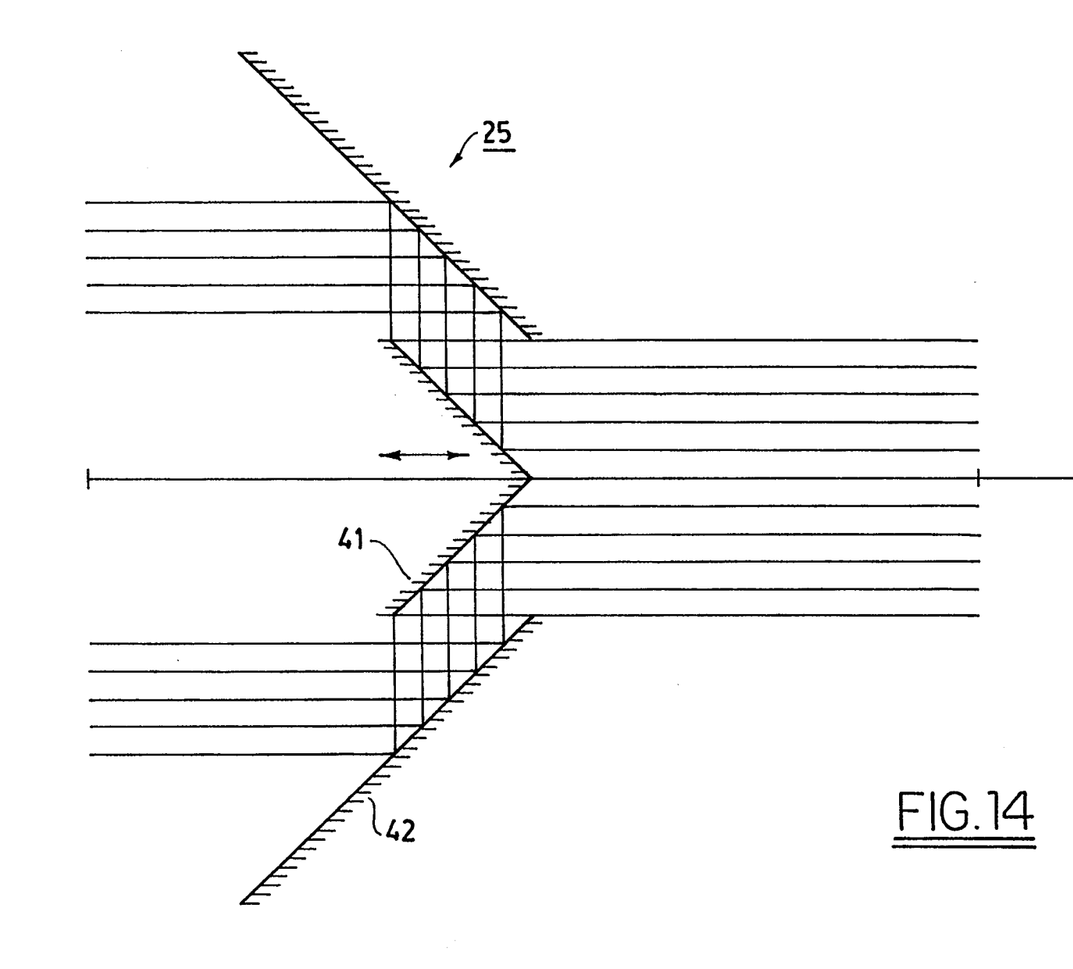
FIG. 14 shows the conical reflective elements of FIG. 13 adjusted to a position reducing the radius of the annular illumination intensity profile.

A pair of conic surfaced reflective elements 41 and 42 can also serve as profiler 25, as shown in FIGS. 13 and 14. Convex conical mirror 41 diverges the illumination into an annular configuration that is countered by conical mirror 42. Again, the radius of the annular profile varies with the distance between movable elements 41 and 42. This radius cannot be reduced to near zero, as it can by proximity positioning the elements 33, 34 or 35, 36 or 37, 38; but under some circumstances this may not be a disadvantage.

The illumination is preferably collimated or approximately collimated in the region of profiler 25 so that illumination that is approximately parallel with the optical axis is diverged by the diverging element and is restored to parallelism with the optical axis by the counter diverging element. Other angular variations can be introduced into the ray paths and the divergence and counter divergence paths, but this makes the design of profiler 25 unnecessarily complex.

Movement of one of the elements of profiler 25 is preferably under control of computer 60 for operation from a keyboard. Then adjustments in the radius of an annular intensity profile or the absence of an annular profile can be made quickly and conveniently.

Figure 12:
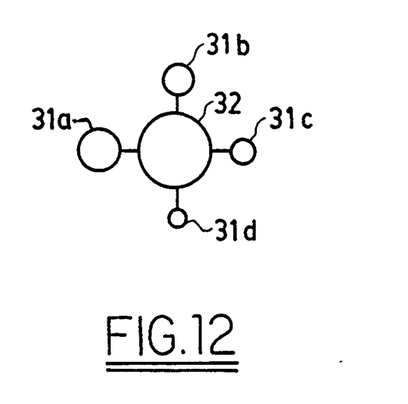
FIG. 12 schematically shows a rotatable element carrying different size masks movable into the pupil region of the inventive illuminator.

The annular intensity profile imposed on the illumination by profiler 25 appears at the pupil region 30 of illuminator 20 where a generally unilluminated gap occurs in the center of an illuminated annulus. To ensure that the unilluminated center of the annular profile remains dark, mask 31 is preferably positioned on the optical axis in pupil region 30. To accommodate annular intensity profiles that vary in radius, the size of mask 31 also preferably varies in radius. This can be accomplished by mounting a number of masks 31a–d on a rotary element 32, as shown in FIG. 12. Turning element 32, preferably under control of computer 60, then rotates any desired one of the different size masks 31a–d into the center of pupil region 30. A variable iris can also be positioned in pupil region 30 to mask the outer periphery of the illumination passing through. Since most of the illumination is given an annular profile by varier 25, very little illumination is lost by the use of central and peripheral masks around the inside and outside of the annular intensity profile in pupil region 30.

Figure 4:
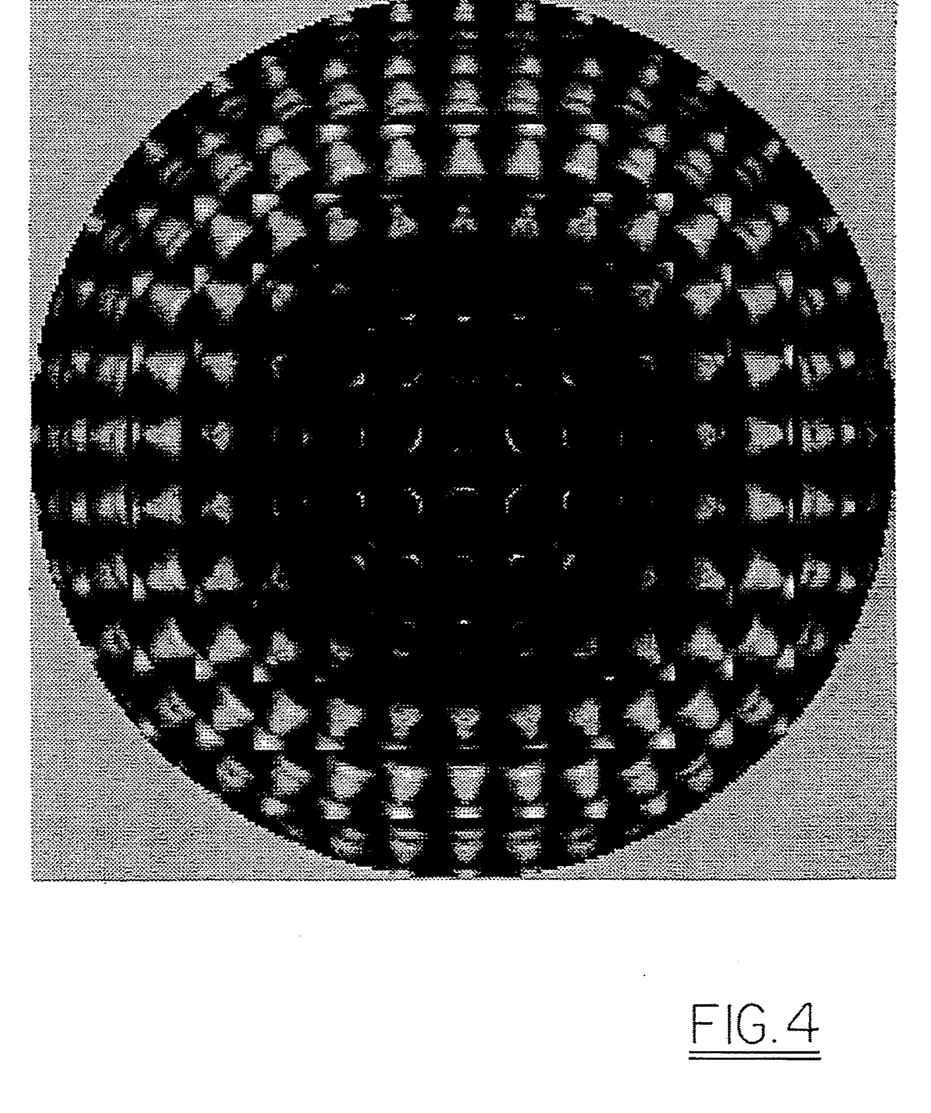
FIGS. 4 and 5 are schematic computer models of pupil illumination intensity profiles corresponding respectively to FIGS. 2 and 3.
Figure 5:
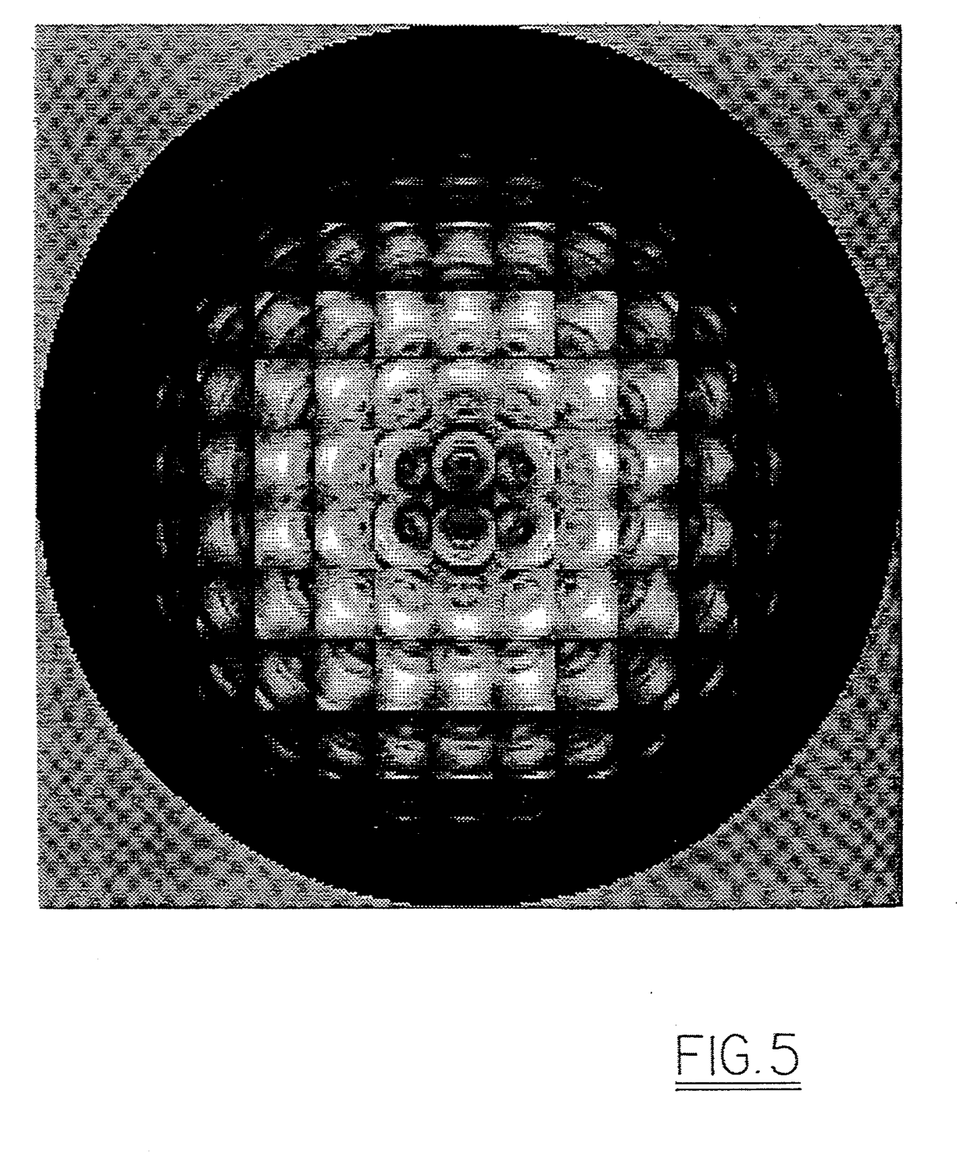

The appearance of the annular illumination profile in pupil region 30 is shown in the schematic computer modelings of FIGS. 4 and 5. An annular intensity profile is shown in FIG. 4, corresponding with the profiler position of FIG. 2. The circular standard illumination profile shown in FIG. 5 corresponds to the position of profiler 25 shown in FIG. 3. The segmented appearance of the illumination is caused by uniformizer 24. Introduction of mask 31 can eliminate the small amount of stray illumination appearing within the annular profile in FIG. 4.

Figure 6:
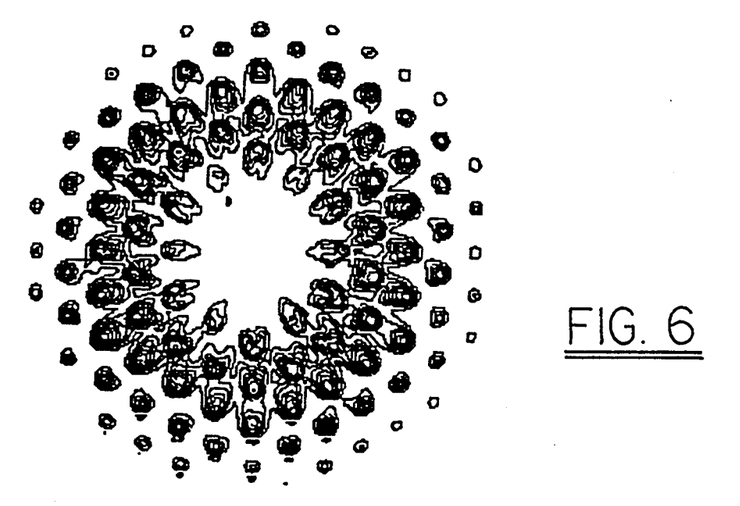
FIGS. 6 and 7 are images of pupil illumination intensity profiles at the pupil of the illuminator corresponding respectively to the illumination intensity profile variations of FIGS. 2 and 3 and to FIGS. 4 and 5.
Figure 7:
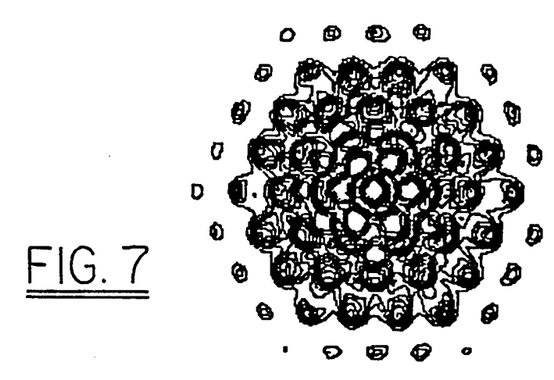
Figure 8:
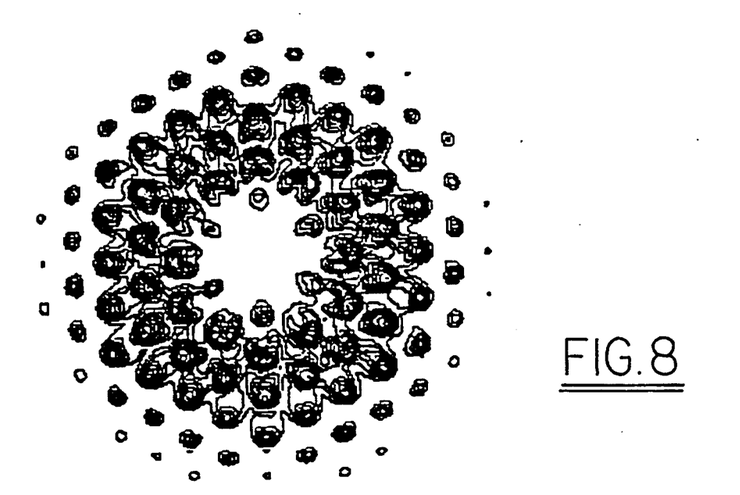
FIG. 8 is an image of a pupil illumination intensity profile that is intermediate to ones shown in FIGS. 6 and 7.

An image of the annular illumination profile produced by the FIG. 2 position of profiler 25 is shown in FIG. 6. This is produced by pinhole illumination of a video camera arranged downstream of reticle plane R. A non-annular illumination intensity profile is shown in FIG. 7, corresponding to the position of profiler 25 shown in FIG. 3. The FIG. 8 image, made in the same way as the images of FIGS. 6 and 7, shows a smaller radius of annular illumination intensity caused by a profiler position between the ones shown in FIGS. 2 and 3.

We claim:

1. A combination of an illuminator and a photolithographic projection imager, the combination comprising:
   a. an illuminator optical system for directing illumination from a source to a pupil of the illuminator from which a reticle is illuminated to be imaged on a wafer by an objective imaging system;
   b. the illuminator in a collimated region of illumination upstream of the illuminator pupil having a pair of refractive elements having conical surfaces that are respectively concave and convex; and
   c. said elements being arranged so that an upstream one of said elements diverges the illumination into a single beam having an annular configuration of intensity and a downstream one of said elements counters the divergence caused by the upstream element, to give the illumination an annular intensity profile of the single beam at the pupil of the illuminator.

2. The combination of claim 1 wherein the distance between said elements is variable, to vary the radius of said annular intensity profile to accommodate characteristics of the reticle.

3. The combination of claim 2 wherein said distance between said elements can be reduced enough to counter said divergence approximately at its source to keep said intensity configuration from becoming annular.

4. The combination of claim 1 wherein said upstream element has said concave conical surface and said downstream element has said convex conical surface.

5. The combination of claim 1 wherein a mask is positionable at said pupil within said annular intensity profile.

6. The combination of claim 1 wherein said concave and convex conical surfaces have the same conic angle.

7. The combination of claim 1 wherein said elements are separated by an air gap.

8. The combination of claim 1 wherein said conical surfaces are arranged to confront each other.

9. The combination of claim 8 wherein the distance between said elements is variable, to vary the radius of said annular intensity profile to accommodate characteristics of the reticle.

10. The combination of claim 8 wherein said conical surfaces can be moved into proximity for countering said divergence to keep said intensity configuration from becoming annular.

11. The combination of claim 10 wherein a mask of variable size is positionable downstream of said conical surfaces within said annular intensity profile.

12. The combination of claim 1 wherein said refractive elements are faceted.

13. In an illuminator for a photolithographic projection imager, the improvement comprising:
    a. a first refractive element arranged in a collimated region of an illumination path of said illuminator upstream of a pupil of said illuminator so that a conical surface of said first refractive element diverges the illumination into a single beam having an annular configuration of intensity;
    b. a second refractive element arranged to receive diverged illumination from said first refractive element, and said second refractive element having a conical surface arranged for countering the illumination divergence caused by said first refractive element, to fix the radius of the divergence of the single beam of said illumination; and
    c. the radius of divergence of the illumination output from the second refractive element appearing as an annular intensity profile of illumination at the pupil region of the illuminator causing illumination with an annular intensity profile to illuminate a reticle that is imaged onto a wafer by an objective imaging system of the photolithographic projection imager.

14. The improvement of claim 13 wherein said conical surface of said first refractive element is concave, and said conical surface of said second refractive element is convex.

15. The improvement of claim 13 wherein said first and second refractive elements are separated by an air gap.

16. The improvement of claim 13 wherein a distance between said refractive elements is variable for varying said radius of illumination divergence to accommodate characteristics of the reticle.

17. The improvement of claim 16 wherein a minimum of said variable distance between said refractive elements results in said second element countering the illumination divergence so that the configuration of illumination intensity does not become annular.

18. The improvement of claim 16 including a variable size mask arranged for blocking illumination within said annular configuration of intensity.

19. The improvement of claim 13 wherein said conic surfaces of said first and second refractive elements have the same conic angle.

20. The improvement of claim 13 wherein said conic surfaces of said first and second refractive elements confront each other.

21. The improvement of claim 20 wherein a distance between said refractive elements is variable for varying said radius of illumination divergence to accommodate characteristics of the reticle.

22. The improvement of claim 21 wherein said illumination divergence is substantially eliminated by moving said conic surfaces into proximity.

23. The improvement of claim 21 wherein illumination within said annular configuration of intensity is blocked by a mask.

24. The improvement of claim 13 wherein said conic surfaces of said first and second refractive elements face away from each other.

25. The improvement of claim 13 wherein said refractive elements are faceted.

26. An illuminator combined with a photolithographic projection imager, the combination comprising:
  a. the illuminator having an optical system for directing illumination along an optical axis of the illuminator upstream of a pupil of the illuminator so that an intensity profile of the illumination at the illuminator pupil is directed to a reticle that is imaged on a wafer by an objective imaging system of the photolithographic projection imager;
  b. a diverging element arranged in a collimated region of the illumination path of said illuminator upstream of the illuminator pupil for diverging said illumination into a single beam having an annular configuration of intensity;
  c. a counter diverging element arranged in said illumination path at a variable distance from said diverging element for receiving said diverging illumination;
  d. said counter diverging element being arranged for countering the divergence of said illumination and fixing the radius of said annular configuration of intensity of the single beam as a function of the distance between said elements; and
  e. the annular configuration of illumination intensity output from the counter diverging element appearing as an annular intensity profile of the single beam of illumination at the illuminator pupil and at the reticle so that the radius of the annular intensity profile accommodates characteristics of the reticle.

27. The combination of claim 26 wherein said elements are refractive and have faceted surfaces.

28. The combination of claim 26 wherein said elements are concentrically diffractive.

29. The combination of claim 26 wherein said elements are reflective and have conical surfaces, 30. The combination of claim 26 wherein said elements are refractive and have conical surfaces, 31. The combination of claim 30 wherein said conical surfaces are concave on one of said elements and convex on another of said elements.

32. The combination of claim 31 wherein said concave and convex conical surfaces confront each other.

33. The combination of claim 32 wherein said counter diverging element can be positioned for countering said diverging illumination so that the illumination intensity profile does not become annular.

34. The combination of claim 31 wherein said concave and convex conical surfaces face away from each other, 35. The combination of claim 26 wherein said diverging element is refractive and has a concave conical surface, 36. The combination of claim 37 wherein said counter diverging element is refractive and has a convex conical surface.

37. The combination of claim 26 wherein said counter diverging element can be positioned for countering said diverging illumination so that said intensity configuration does not become annular.

38. The combination of claim 26 including a variable size mask positioned to block illumination within said annular configuration.

* * * * *